(12) United States Patent
Hamanaka et al.

(10) Patent No.: US 8,963,524 B2
(45) Date of Patent: Feb. 24, 2015

(54) DRIVE CIRCUIT FOR SWITCHING ELEMENTS

(71) Applicant: Denso Corporation, Kariya, Aichi-pref. (JP)

(72) Inventors: Yoshiyuki Hamanaka, Kariya (JP); Ryotaro Miura, Kariya (JP)

(73) Assignee: Denso Corporation, Kariya (JP)

( * ) Notice: Subject to any disclaimer, the term of this patent is extended or adjusted under 35 U.S.C. 154(b) by 143 days.

(21) Appl. No.: 13/783,983

(22) Filed: Mar. 4, 2013

(65) Prior Publication Data

US 2013/0229208 A1 Sep. 5, 2013

(30) Foreign Application Priority Data

Mar. 2, 2012 (JP) ................ 2012-046083

(51) Int. Cl.
| | |
|---|---|
| G05F 1/00 | (2006.01) |
| G05F 3/04 | (2006.01) |
| G05F 3/08 | (2006.01) |
| H03K 17/081 | (2006.01) |
| H03K 17/18 | (2006.01) |

(52) U.S. Cl.
CPC .............. *H03K 17/081* (2013.01); *H03K 17/18* (2013.01); *H03K 2217/0063* (2013.01); *H03K 2217/0072* (2013.01)
USPC ......................................... 323/282; 323/311

(58) Field of Classification Search
USPC ................ 323/282, 311; 318/400.17, 400.21, 318/400.26
See application file for complete search history.

(56) References Cited

U.S. PATENT DOCUMENTS

| | | | |
|---|---|---|---|
| 4,949,213 A | 8/1990 | Sasagawa et al. | |
| 6,335,608 B1 | 1/2002 | Takahashi | |
| 8,525,451 B2 * | 9/2013 | Kitamoto | 318/255 |
| 2012/0217937 A1 * | 8/2012 | Miyauchi et al. | 322/28 |
| 2012/0249020 A1 * | 10/2012 | Komatsu et al. | 318/139 |

FOREIGN PATENT DOCUMENTS

| | | |
|---|---|---|
| JP | 2913699 | 4/1999 |
| JP | 3548497 | 4/2004 |

* cited by examiner

*Primary Examiner* — Emily P Pham
(74) *Attorney, Agent, or Firm* — Nixon & Vanderhye PC

(57) ABSTRACT

A first-path connects an input-terminal and an output-terminal of a high-potential-side switching-element and includes a high-potential-side rectifying-device and a high-potential-side passive-element. A second-path connects the output-terminal of the high-potential-side switching-element and the output-terminal of a low-potential-side switching-element and includes a low-potential-side rectifying-device and a low-potential-side passive-element. A high-potential-side applying-unit applies voltage to a connecting point between the high-potential-side rectifying-device and the high-potential-side passive-element. A high-potential-side determining-unit determines that an overcurrent is flowing between the input-terminal and the output-terminal of the high-potential-side switching-element by using a first-value. A limiting-unit limits a current between the low-potential-side rectifying-device and the output-terminal of the high-potential-side switching-element if the overcurrent is flowing. A low-potential-side applying-unit applies voltage to a connecting point between the low-potential-side rectifying-device and the low-potential-side passive-element. A low-potential-side determining-unit determines that an overcurrent is flowing between the input-terminal and the output-terminal of the high-potential-side or low-potential-side switching element by using a second-value.

6 Claims, 8 Drawing Sheets

DRIVE CIRCUIT FOR SWITCHING ELEMENTS

CROSS-REFERENCE TO RELATED APPLICATION

This application is based on and claims the benefit of priority from earlier Japanese Patent Application No. 2012-46083 filed Mar. 2, 2012, the description of which is incorporated herein by reference.

BACKGROUND

1. Technical Field

The present invention relates to a drive circuit for switching elements which is applied to a power inverter circuit including a high-potential side switching element and a low-potential side switching element connected to the high-potential side switching element in series.

2. Related Art

This type of drive circuit is disclosed in Japanese Patent No. 3548497. The drive circuit detects the fact that an overcurrent is flowing to a semiconductor switching element (IGBT). In this drive circuit, the collector and the emitter of a switching element are connected to each other via a diode and a series connection of resistors. In particular, the anode of the diode is connected to one end of the series connection of resistors. The cathode of the diode is connected to the collector. In addition, the connecting point between the series connection of resistors and the anode of the diode is connected to the gate of the switching element via a resistor. The gate of the switching element is connected to an electronic power supply for charging the gate.

According to the above configuration, the fact can be detected that an overcurrent is flowing to the switching element, on the basis of the electric potential of the connecting point of the resistors connected in series. According to the principle of the detection, if the switching element is turned on, the gate is charged by the electronic power supply. Thereby, the gate voltage increases, and thereafter, the switching element is switched from an OFF state to an ON state.

When an overcurrent does not flow between the collector and the emitter of the switching element, the voltage between the collector and the emitter significantly decreases. Hence, a current flows from the gate to the collector via the diode. The electric potential of the connecting point between the series connection of resistors and the diode decreases. Hence, the electric potential of the connecting point of the resistors connected in series decreases to the electric potential in the vicinity of the electric potential of the emitter. In contrast, when an overcurrent flows, the voltage between the collector and the emitter is maintained at a high voltage even though the switching element is changed to an ON state. Hence, a current does not flow from the gate to the collector via the diode. Thereby, the electric potential of the connecting point of the resistors connected in series is a value obtained by dividing the gate voltage by using the resistors, and is higher than the electric potential in the vicinity of the electric potential of the emitter.

As described above, the fact can be detected that an overcurrent is flowing between the collector and the emitter of the switching element, on the basis of the electric potential of the connecting point varying depending on whether or not an overcurrent is flowing.

If an overcurrent is detected by the above technique, a configuration for transmitting information, which is concerning the fact that an overcurrent is flowing, to the outside of the present drive circuit is required, to appropriately perform a failsafe process later. In this case, to restrict the increase in the number of components and size of the drive circuit, the number of components of the configuration for transmitting information to the outside of the present drive circuit is required to be reduced.

SUMMARY

An embodiment provides a drive circuit for switching elements which can reduce the number of components of a configuration for transmitting information, which is concerning the fact that an overcurrent is flowing to the switching element, to the outside of the drive circuit.

As an aspect of the embodiment, a drive circuit for switching elements which is applied to a power inverter circuit including a high-potential side switching element and a low-potential side switching element connected to the high-potential side switching element in series includes: a first electric path which connects an input terminal and an output terminal of the high-potential side switching element and which includes a high-potential side rectifying device, which blocks a flow of current from the input terminal to the output terminal, and a high-potential side passive element, the high-potential side rectifying device and the high-potential side passive element being arranged sequentially from the input terminal of the high-potential side switching element; a second electric path which connects the output terminal of the high-potential side switching element and the output terminal of the low-potential side switching element and which includes a low-potential side rectifying device, which blocks a flow of current from the output terminal of the high-potential side switching element to the output terminal of the low-potential side switching element, and a low-potential side passive element, the low-potential side rectifying device and the low-potential side passive element being arranged sequentially from the output terminal of the high-potential side switching element; a high-potential side applying unit which applies voltage to a connecting point between the high-potential side rectifying device and the high-potential side passive element during a time period during which the high-potential side switching element is turned on; a high-potential side determining unit which determines that an overcurrent is flowing between the input terminal and the output terminal of the high-potential side switching element on the basis of the fact that an electric potential of the connecting point between the high-potential side rectifying device and the high-potential side passive element exceeds a first specified value even though the high-potential side switching element is change from an OFF state to an ON state; a limiting unit which limits a flow of current between the low-potential side rectifying device and the output terminal of the high-potential side switching element if the high-potential side determining unit determines that the overcurrent is flowing; a low-potential side applying unit which applies voltage to a connecting point between the low-potential side rectifying device and the low-potential side passive element during a time period during which the low-potential side switching element is turned on; and a low-potential side determining unit which determines that an overcurrent is flowing between the input terminal and the output terminal of the high-potential side switching element or the low-potential side switching element on the basis of the fact that an electric potential of the connecting point between the low-potential side rectifying device and the low-potential side passive element exceeds a second specified value even though the low-potential side switching element is changed from an OFF state to an ON state.

DETAILED DESCRIPTION OF THE PREFERRED EMBODIMENTS

With reference to the accompanying drawings, hereinafter will be described embodiments of the present invention.

First Embodiment

Hereinafter, the first embodiment will be described in which a drive circuit for switching elements is applied to a vehicle equipped with a rotating machine as an in-vehicle traction unit.

Figure 1:
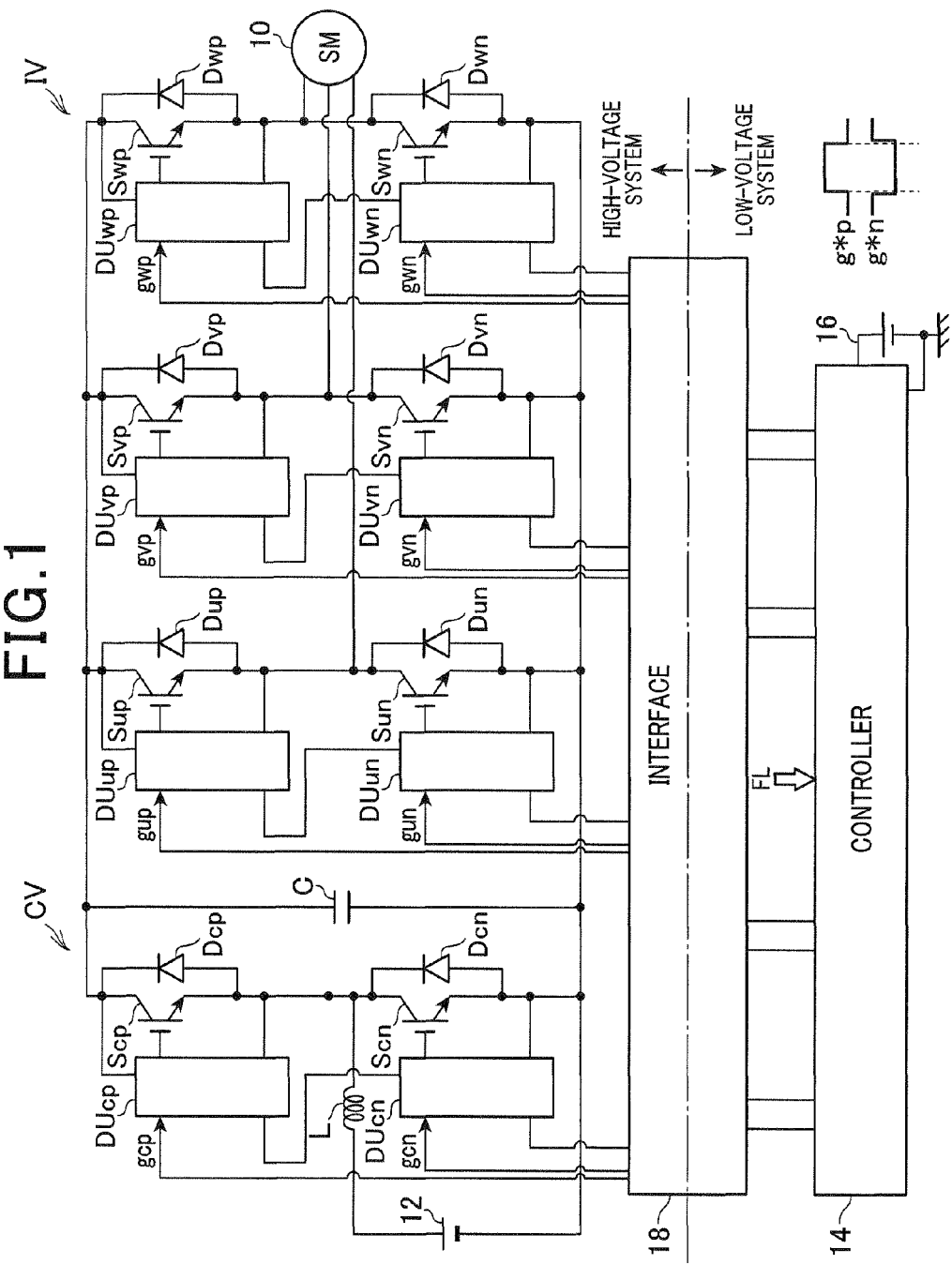
FIG. 1 is a diagram showing a configuration of a system according to a first embodiment.

FIG. 1 is a diagram showing the whole configuration of a system according to the present embodiment.

A motor generator 10 is a three-phase rotating machine mechanically connected to drive wheels, which are not shown. The motor generator 10 is connected to a high-voltage battery 12 via an inverter IV, which is a DC-AC conversion circuit, and a converter CV, which is a DC power supply. The converter CV includes a capacitor C, a pair of switching elements Scp, Scn which are connected to the capacitor C in parallel, and a reactor L connecting between a positive electrode of the high-voltage battery 12 and the connecting point between the pair of pair of switching elements Scp, Scn. In particular, the converter CV has a function for increasing the voltage of the high-voltage battery 12 (e.g. 288 V) by turning on and off the switching elements Scp, Scn, providing that the upper limit is a predetermined voltage (e.g. 666 V).

The inverter IV includes a series connection of switching elements Sup, Sun, a series connection of switching elements Svp, Svn, and a series connection of switching elements Swp, Swn. The connection points of the respective series connections are connected to U, V, W phases of the motor generator 10.

Note that, in the present embodiment, as the switching elements S*# (*=c, u, v, w; #=p, n), insulated gate bipolar transistors (IGBT) are used. In addition, each of the switching elements S*# is connected to a free wheel diode D*# in parallel.

A controller 14 uses a low-voltage battery 16 as a power supply, and operates the inverter IV and the converter CV to desirably control controlled variables (e.g. torque) of the motor generator 10. In particular, the controller 14 outputs operation signals gcp, gcn to the converter CV via a photocoupler 18, which is an interface, and drive units DUcp, DUcn, to operate the switching elements Scp, Scn. The controller 14 outputs operation signals gup, gun, gyp, gvn, gwp, gwn to the inverter IV via the photocoupler 18 and drive units DUup, DUun, DUvp, DUvn, DUwp, DUwn, to operate the switching elements Sup, Sun, Svp, Svn, Swp, Swn.

Incidentally, an operation signal g*p for a high-potential side switching element S*p and an operation signal g*n for a low-potential side switching element S*n corresponding to the high-potential side switching element S*p are complementary to each other. That is, the high-potential side switching element S*p and the low-potential side switching element S*n corresponding thereto are alternately turned on.

While the photocoupler 18 insulates a high-voltage system including the high-voltage battery 12 from a low-voltage system including the low-voltage battery 16, the photocoupler 18 transmits and receives signals between the high-voltage system and the low-voltage system.

Next, configurations of the drive units DU*# and the periphery thereof will be explained with reference to FIG. 2. Note that, in the present embodiment, the circuit configuration of the high-potential side drive unit DU*p and that of the low-potential side drive unit DU*n are basically the same. Hence, hereinafter, commonalities between the drive unit DU*p and the drive unit DU*n will be first explained. Then, dissimilarities between the drive unit DU*p and the drive unit DU*n will be explained. In addition, in FIG. 2, elements of the low-potential side drive unit DU*n are basically denoted with reference numerals according to reference numerals denoting elements of the high-potential side drive unit DU*p. In particular, elements of the circuit configuration of the high-potential side drive unit DU*p are denoted with indexes "p", and elements of the circuit configuration of the low-potential side drive unit DU*n are denoted with indexes "n".

First, commonalities between the drive units DU*# will be explained.

Figure 2:
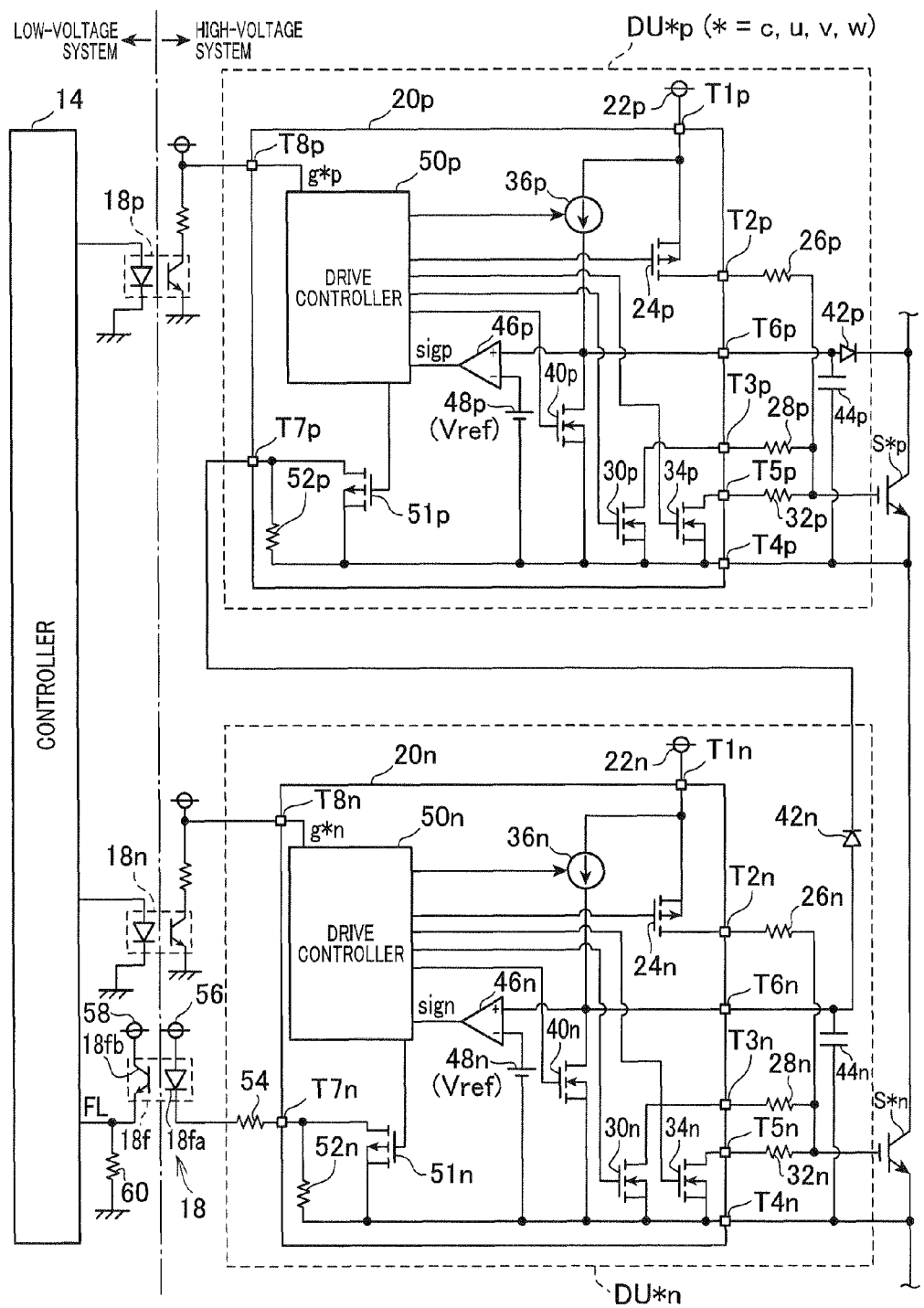
FIG. 2 is a diagram showing a configuration of a drive unit according to the first embodiment.

As shown in FIG. 2, the drive unit DU*# includes a drive IC (integrated circuit) 20# (#=p, n), which is a one-chip semiconductor integrated circuit.

A constant-voltage power supply 22#, which is externally connected to the drive IC 20#, is connected to a terminal T1# of the drive IC 20#. In addition, the terminal T1# is connected to a terminal T2# of the drive IC 20# via a P-channel MOSFET (charging switching element 24#). The terminal T2# is connected an opening and closing control terminal (gate) of the switching element S*# via a charging resistor 26#.

The gate of the switching element S*# is connected to a terminal T3# of the drive IC 20# via a discharging resistor 28#. The terminal T3# is connected to a terminal T4# of the drive IC 20# via an N-channel MOSFET (discharging switching element 30#). The terminal T4# is connected to an output terminal (emitter) of the switching element S*#.

The gate of the switching element S*# is further connected to the terminal T4# via a soft breaking resistor 32#, a terminal T5# of the drive IC 20#, and an N-channel MOSFET (soft breaking switching element 34#).

The terminal T1# is connected to the terminal T4# via a constant-current power supply 36# and an N-channel MOSFET (resetting switching element 40#).

The connecting point between the constant-current power supply 36# and the resetting switching element 40# is connected to a terminal T6# of the drive IC 20#. The terminal T6# is connected to the anode of a diode 42# (high-voltage diode), which is externally connected to the drive IC 20#. In addition, the connecting point between the terminal T6# and the anode of the diode 42# is connected to the emitter via a capacitor 44#, which is externally connected to the drive IC 20#. Note that the diode 42# is a rectifying device preventing reliability of the drive IC 20# from decreasing when a current (collector current) flowing between an input terminal (collector) and the emitter of the switching element S*# flows to the drive IC 20#. In addition, in the present embodiment, output currents of the constant-current power supplies 36p and 36n are the same. Capacitances of capacitors 44p and 44n are the same.

The terminal T6# is connected to a non-inverting input terminal of a comparator 46#. An electronic power supply 48#, whose terminal voltage is reference voltage Vref is connected to an inverting input terminal of the comparator 46#. A signal outputted from the comparator 46#, which is a determination signal Sig#, is inputted into a drive controller 50# included in the drive IC 20#.

The terminal T4# is connected to a terminal T7# (open drain terminal) of the drive IC 20# via a parallel connection of an N-channel MOSFET (fault transmitting switching element 51#) and a resistor 52#. Note that, in the present embodiment, the fault transmitting switching element 51# is basically in an ON state.

An operation signal g*# is inputted into the drive controller 50# from the controller 14 via a photocoupler 18# and a terminal T8# of the drive IC 20#.

Next, dissimilarities between the high-potential side drive unit DU*p and the low-potential side drive unit DU*n will be explained.

In the high-potential side drive unit DU*p, the cathode of a diode 42p is connected to the collector of the switching element S*p. In the low-potential side drive unit DU*n, the cathode of a diode 42n is connected to a terminal T7p of a high-potential side drive IC 20p.

In the low-potential side drive unit DU*n, a terminal T7n is connected to a power supply 56 via a resistor 54 and a photodiode 18fa of a photocoupler 18f. In particular, the anode of the photodiode 18fa is connected to the power supply 56, and the cathode of the photodiode 18fa is connected to one end of the resistor 54.

The collector of a phototransistor 18fb of the photocoupler 18f is connected to a power supply 58, and the emitter of the photodiode 18fb is grounded via a resistor 60. Note that a signal at the connecting point between the emitter of the phototransistor 18fb and the resistor 60, which is a fail signal FL, is inputted into the controller 14.

Next, charging and discharging processes for gates performed by the drive controller 50# (#=p, n) will be explained.

According to the charging process for gates, the operation signal g*# inputted into the drive controller 50# via a terminal T8# serves as an ON operation command, whereby the drive controller 50# turns on the charging switching element 24# and turns off the discharging switching element 30#. Thereby, the gate is charged by the constant-voltage power supply 22#, which changes the switching element S*# from an OFF state to an ON state. According to the discharging process for gates, the operation signal g*# serves as an OFF operation command, whereby the drive controller 50# turns off the charging switching element 24# and turns on the discharging switching element 30#. Thereby, the gate is discharged, which changes the switching element S*# from an ON state to an OFF state.

Next, an overcurrent protection process performed by the drive controller 50# will be explained.

According to this process, if it is determined that a collector current becomes equal to or more than a threshold current on the basis of a non-saturated voltage between the collector and the emitter, the soft breaking switching element 34# is changed to an ON state to forcibly turning off the switching element S*#. Note that the non-saturated voltage is a voltage between the collector and the emitter in a non-saturated voltage region where the collector current increases as the voltage between the collector and the emitter increases. The threshold current is an upper limit of the collector current which can maintain the reliability of the switching element S*#.

Figure 3:
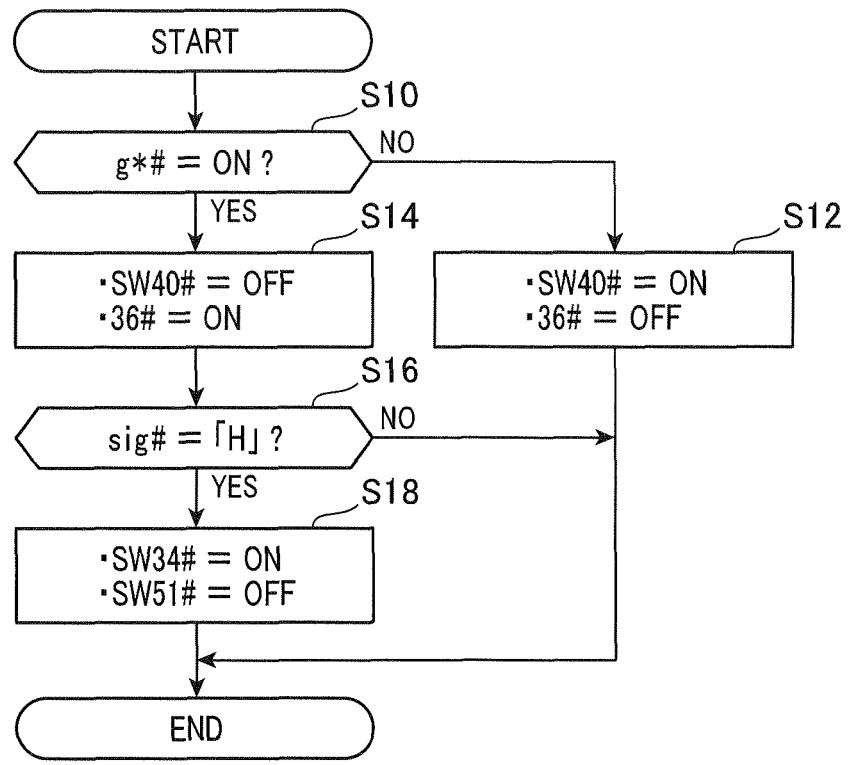
FIG. 3 is a flow diagram showing a procedure of an overcurrent protection process according to the first embodiment.
Figure 4:
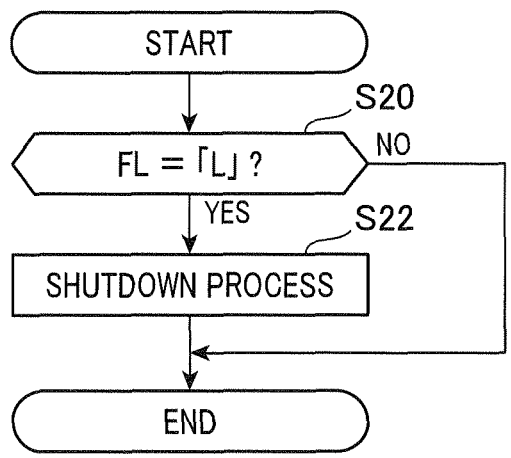
FIG. 4 is a flow diagram showing a procedure of a failsafe process according to the first embodiment.

FIG. 3 shows a procedure of the overcurrent protection process according to the present embodiment. Note that since the drive controller 50# is hardware, the process shown in FIG. 3 is performed by a logic circuit.

In this process, first in step S10, it is determined whether or not the operation signal g*# is an ON operation command.

If a negative determination is done in step S10, the process proceeds to step S12, in which the resetting switching element 40# is turned on, and outputting current from the constant-current power supply 36# is stopped. Note that the resetting switching element 40# is turned on, after it is determined that an overcurrent is flowing to the switching element S*# by a technique described later and when the converter CV or the inverter IV is used again, to prevent the erroneous determination that an overcurrent would flow again due to a larger difference in potential across the capacitor 44#.

If a positive determination is done in step S10, the process proceeds to step S14, in which the resetting switching element 40# is turned off, and current is outputted from the constant-current power supply 36#.

In succeeding step S16, it is determined whether or not the logic of the determination signal Sig# is "H". This process is performed to determine whether or not an overcurrent is flowing between the collector and the emitter of the switching element S*#. Hereinafter, the principle of detecting an overcurrent will be explained.

When the operation signal g*# is changed from an OFF operation command to an ON operation command, charging the gate is started according to the charging process. Thereby, increasing the gate voltage is started.

In addition, by changing the operation signal g*# to an ON operation command, the capacitor 44# is charged by the current outputted from the constant-current power supply 36#. Hence, the difference in potential across the capacitor 44# (voltage of the terminal T6#) starts increasing.

Thereafter, before the gate voltage reaches a threshold voltage for turning on the switching element S*#, a high voltage is maintained between the collector and the emitter. Hence, the electric potential at the anode of the diode 42# becomes lower than the electric potential at the cathode thereof. Thereby, the flow of the current from the terminal T6# to the diode 42# is blocked by the diode 42#. As a result, the voltage of the terminal T6# continues increasing. Thereafter, when the gate voltage exceeds the threshold voltage, the switching element S*# is changed from an OFF state to an ON state.

When an overcurrent does not flow to the switching element S*#, the switching element S*# is changed to an ON state. Thereby, on resistance of the switching element S*# becomes very small, which significantly decreases the voltage Vce between the emitter and the collector (e.g. to 1 V). Hence, the electric potential of the collector decreases toward the electric potential of the emitter, which decreases the electric potential of the collector below the electric potential of the anode of the diode 42#.

Note that, in the present embodiment, the reference voltage Vref is higher than the sum of the voltage between the collector and the emitter, which is obtained when the switching element S*# is in an ON state and an overcurrent is not flowing, and the forward voltage of the diode 42#. In addition, the reference voltage Vref is lower than the voltage between the collector and the emitter obtained when the collector current becomes equal to the threshold current. Hence, charge stored in the capacitor 44# is emitted to the collector via the diode 42#, thereby decreasing the voltage of the terminal 6#. In particular, the voltage of the terminal T6# decreases to the above sum.

Hence, the voltage of the terminal 6# does not reach the reference voltage Vref of the electronic power supply 48# while the operation signal g*# serves as an ON operation command. Hence, the logic of the determination signal Sig# is maintained at "L".

In contrast, when an overcurrent is flowing to the switching element S*#, the voltage between the collector and the emitter becomes higher due to the larger collector current, even though the switching element S*# is changed to an ON state when the gate voltage exceeds the threshold voltage. Hence, the electric potential at the anode of the diode 42# becomes smaller than the electric potential of the collector. Thereby, the flow of the current from the terminal T6# to the collector via the diode 42# is blocked. Hence, even when the switching element S*# is changed to an ON state, supplying current from the constant-current power supply 36# to the capacitor 44# is continued. As a result, the voltage of the terminal T6# exceeds the reference voltage Vref, whereby the logic of the determination signal Sig# is inverted to "H".

If a positive determination is done in step S16, the process proceeds to step S18, in which the soft breaking switching element 34# is turned on, and the charging switching element 24# and the discharging switching element 30# are tuned off. Thereby, the gate is discharged via the soft breaking resistor 32#, which forcibly changes the switching element S*# to an OFF state. Note that the soft breaking resistor 32# is for making the resistance value of the discharging path higher. In particular, the resistance value of the soft breaking resistor 32# is set to be higher than the resistance value of the discharging resistor 28#. This considers that, under the condition that the collector current is excessive, if the speed of changing the switching element S*# from an ON state to an OFF state, that is, breaking speed between the collector and the emitter, is increased, surge voltage can become excessive.

In the present step, a process for changing the fault transmitting switching element 51# to an OFF state is also performed. Hereinafter, this process is explained for a high-potential side fault transmitting switching element 51p and a low-potential side fault transmitting switching element 51n separately.

First, an operation of the high-potential side fault transmitting switching element 51p will be explained.

The process for changing the fault transmitting switching element 51p to an OFF state is a process for transmitting to the low-potential side drive unit DU*n the fact that an overcurrent is flowing between the collector and the emitter of the high-potential side switching element S*p.

That is, when the fault transmitting switching element 51p is changed to an OFF state, the electric path connecting between the cathode of the diode 42n and the emitter of the high-potential side switching element S*p includes a resistor 52p. Note that, in the present embodiment, the resistance value of the resistor 52p is set to be a very large value. Hence, when the low-potential side switching element S*n is changed to an ON state, discharging the capacitor 44n to the emitter of the high-potential side switching element S*p via the diode 42n is limited. Thereby, even when an ON operation command is issued to the low-potential side switching element S*n, the difference in potential across the capacitor 44n (voltage of the terminal T6n) continues to increase, which inverts the logic of the determination signal Sign to "H". In this way, the fact is transmitted to the low-potential side drive unit DU*n that an overcurrent is flowing between the collector and the emitter of the high-potential side switching element S*p.

Next, an operation of the low-potential side fault transmitting switching element 51n will be explained.

The process for changing the fault transmitting switching element 51n to an OFF state is a process for transmitting to the controller 14 the fact that an overcurrent is flowing to either of the switching element S*p or the switching element S*n.

That is, in the present embodiment, the resistance value of the resistor 52n is set to be a very large value. Hence, when the fault transmitting switching element 51n is changed to an OFF state, the resistance value of an electric path from the power supply 56 to the emitter of the switching element S*n increases, which significantly decreases the amount of current flowing to the photodiode 18fa of the photocoupler 18f. Hence, the phototransistor 18fb of the photocoupler 18f in the low-voltage system is changed to an OFF state, which inverts the logic of the fail signal FL inputted into the controller 14 from "H" to "L". In this way, the fact that an overcurrent is flowing is transmitted to the controller 14.

If a negative determination is done in step S16, or steps S12 and S18 are completed, the failsafe process is ended.

Next, a failsafe process performed by the controller 14 will be described. This process is repeatedly performed in a predetermined period.

In this process, first in step S20, it is determined whether or not the logic of the fail signal FL is "L".

If a positive determination is done in step S20, it is determined that an overcurrent is flowing between the collector and the emitter of the high-potential side switching element S*p or the low-potential side switching element S*n. Then, the process proceeds to step S22. In step S22, an operation signal g*# for the inverter IV and the converter CV is forcibly changed to an OFF operation command, thereby performing a shutdown process in which the switching element S*# is forcibly changed to an off state.

If a negative determination is done in step S20, or the process of step S22 is completed, the process is ended.

Figure 5:
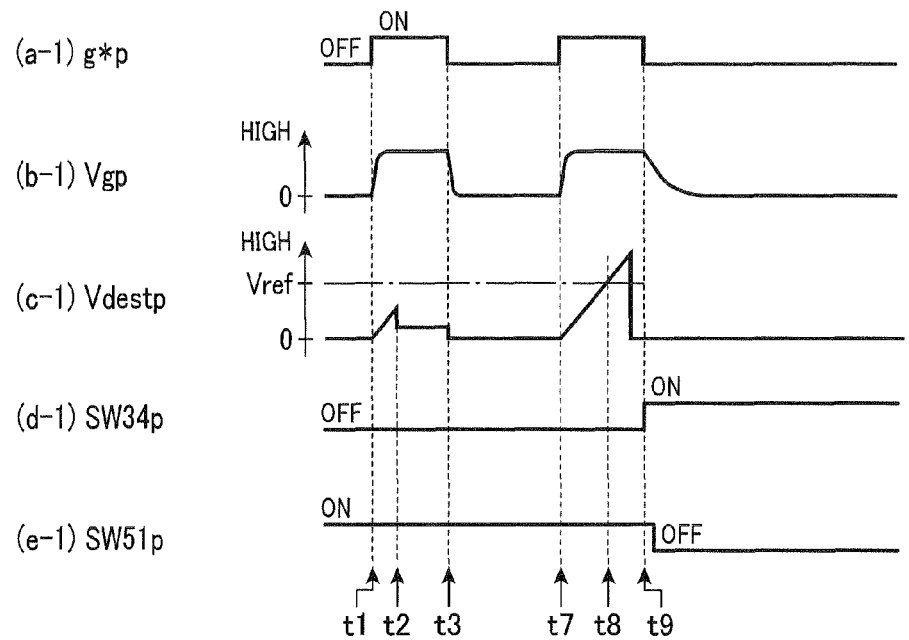
FIG. 5 is a time chart showing an example of the overcurrent protection process according to the first embodiment.
Figure 5:
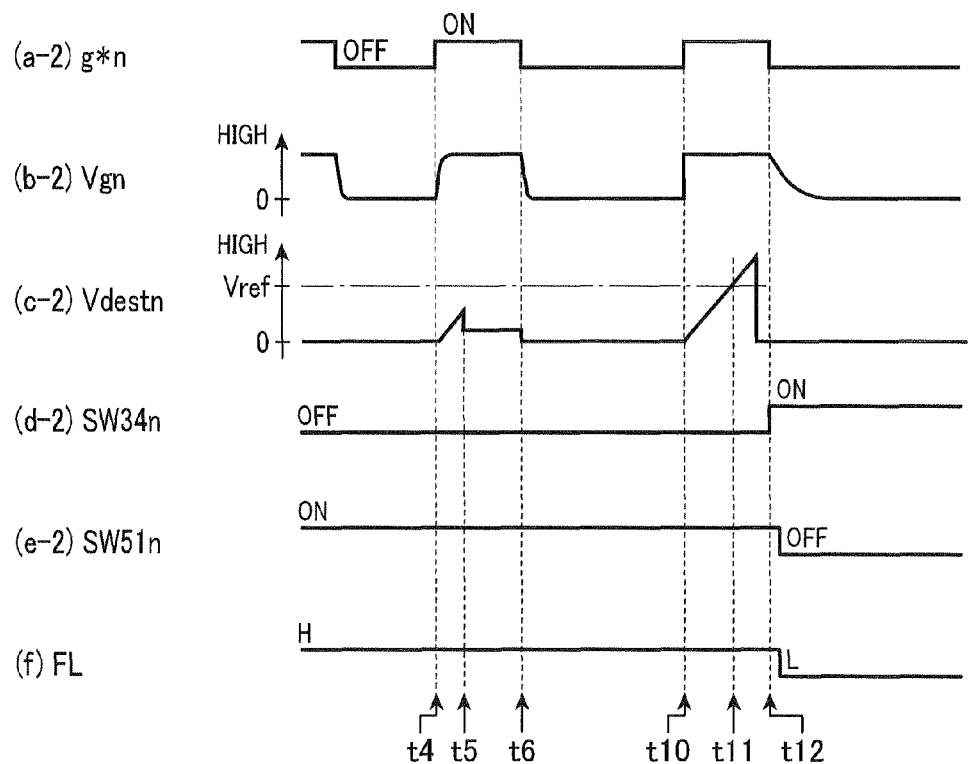

FIG. 5 shows an example of the overcurrent protection process. In FIG. 5, F(a-1) to F(e-1) show the progression of a signal corresponding to the high-potential side drive unit DU*p. F(a-2) to F(e-2) show the progression of a signal corresponding to the low-potential side drive unit DU*n. F(f) shows the progression of the fail signal FL. In particular, F(a-1) and F(a-2) show the progression of the operation signal g*#. F(b-1) and F(b-2) show the progression of gate voltage Vg#. F(c-1) and F(c-2) show the progression of voltage Vdest# of the terminal T6#. F(d-1) and F(d-2) show the progression of an operating state of the soft breaking switching element 34#. F(e-1) and F(e-2) show the progression of an operating state of the fault transmitting switching element 51#.

In the example shown in FIG. 5, at time t1, the operation signal g*p at the high-potential side is changed to an ON operation command. Thereby, gate voltage Vgp and voltage Vdestp of the terminal T6p start increasing. Thereafter, at time t2, the gate voltage Vgp exceeds a threshold voltage, which changes the switching element S*p to an ON state. Thereby, the charge stored in the capacitor 44p is emitted to the collector of the switching element S*p. Hence, the voltage Vdestp of the terminal T6p decreases. Note that, thereafter, at time t3, the operation signal g*p at the high-potential side is changed to an OFF operation command. Thereby, the gate voltage Vgp decreases, which changes the switching element S*p to an OFF state.

Thereafter, at time t4, the operation signal g*n at the low-potential side is changed to an ON operation command. Thereby, gate voltage Vgn and voltage Vdestn of the terminal T6n start increasing. Then, at time t5, the gate voltage Vgn exceeds a threshold voltage, which changes the switching element S*n to an ON state. Thereby, the voltage Vdestn of the terminal T6n decreases. Note that, at time t6, the operation signal g*n at the low-potential side is changed to an OFF operation command. Thereby, the gate voltage Vgn decreases, which changes the switching element S*n to an OFF state.

Thereafter, at time t7, the operation signal g*p at the high-potential side is changed to an ON operation command again. Thereby, the gate voltage Vgp and the voltage Vdestp of the terminal T6p start increasing. Here, since collector current of the switching element S*p exceeds a threshold current, at time t8, the voltage Vdestp of the terminal T6p exceeds the reference voltage Vref. Thereby, thereafter, at time t9, a soft breaking switching element 34p is changed to an ON state, which operates a soft breaking function. Thereafter, the fault transmitting switching element 51p is changed to an OFF state.

Thereafter, at time t10, the operation signal g*n at the low-potential side is changed to an ON operation command again. Here, since the high-potential side fault transmitting switching element 51p has been changed to an OFF state, the charge stored in the capacitor 44n at the low-potential side cannot be emitted. Thereby, the voltage Vdestn of the terminal T6n continues to increase. Hence, at time t11, the voltage Vdestn of the terminal T6n exceeds the reference voltage Vref. Then, at time t12, a soft breaking switching element 34n is changed to an ON state, which operates the soft breaking function. Thereafter, the fault transmitting switching element 51n at the low-potential side is changed to an OFF state. Thereby, the logic of the fail signal FL inputted into the controller 14 is inverted to "L".

As described above, in the present embodiment, a circuit configuration is used in which the cathode of the low-potential side diode 42n is connected to the terminal T7p of the high-potential side drive IC 20p. Hence, a drive controller 50n of the low-potential side drive unit DU*n can determine the fact that an overcurrent is flowing between the collector and the emitter of the high-potential side switching element S*p. That is, a photocoupler corresponding to the high-potential side drive unit DU*p can be omitted.

In addition, since the diode 42n is connected to the terminal T7p (open drain terminal), which is normally included in the drive IC 20p, the above circuit configuration for omitting the photocoupler can be easily realized.

Second Embodiment

Hereinafter, the second embodiment will be described focusing on differences from the first embodiment.

In the present embodiment, the circuit configuration of the low-potential side drive unit DU*n is modified so that overcurrents flowing between the collector and the emitter of the low-potential side switching element S*n can be individually detected.

Figure 6:
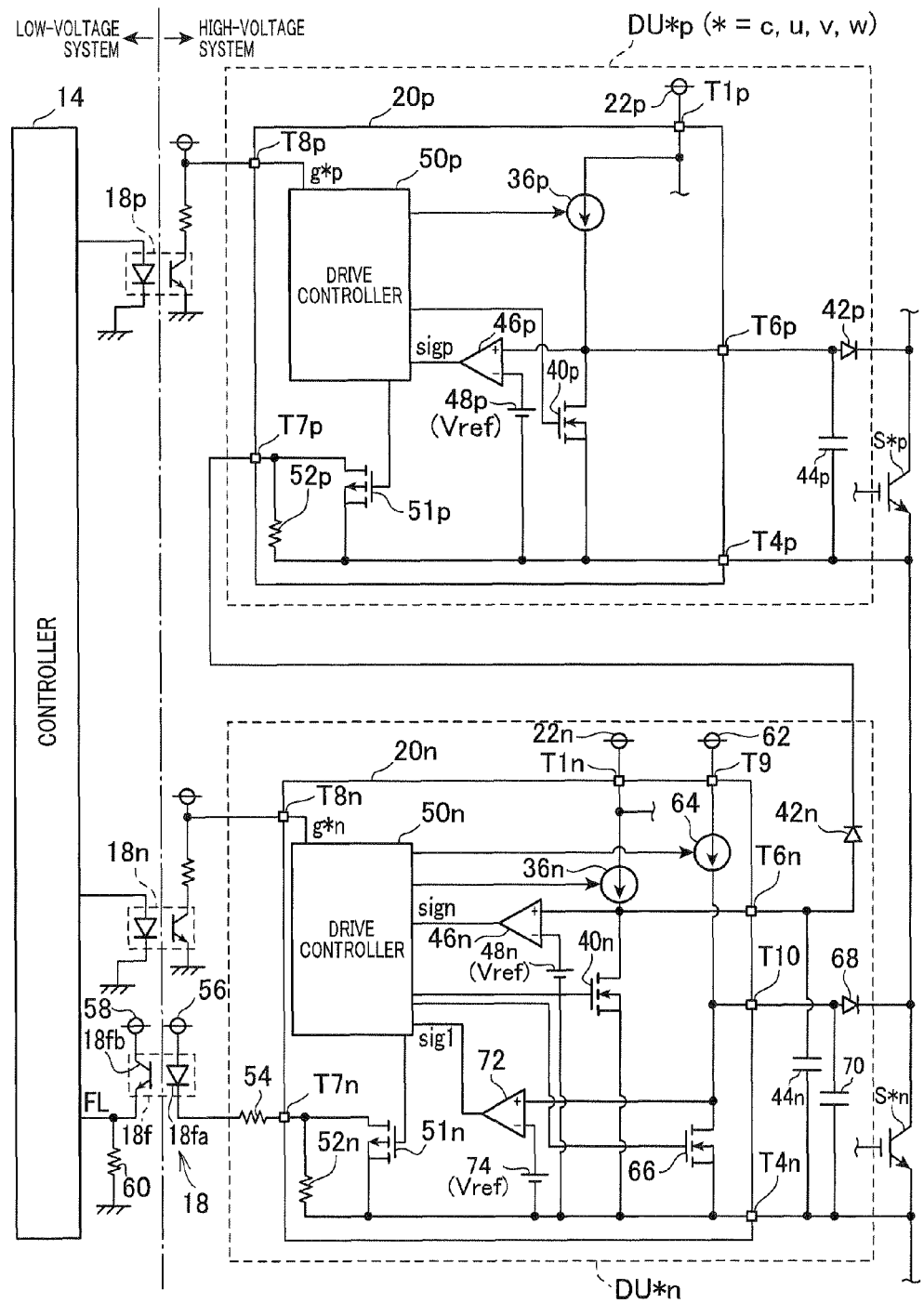
FIG. 6 is a diagram showing a configuration of a drive unit according to a second embodiment.

FIG. 6 shows configurations of the drive units DU*# and the periphery thereof according to the present embodiment. In FIG. 6, the same parts as those of FIG. 2 are denoted with the same reference numerals for the sake of convenience. Note that, in FIG. 6, since parts concerning charging and discharging processes for gate charge of the switching elements S*# and parts concerning the soft breaking function are the same as those in FIG. 2, these parts are omitted in FIG. 6. The circuit configuration of the high-potential side drive unit DU*p is the same as that in FIG. 2. In the present embodiment, the constant-current power supply 36n, a resetting switching element 40n, the diode 42n, and the capacitor 44n are referred to as a first constant-current power supply, a first resetting switching element, a first diode, and a first capacitor.

As shown in FIG. 6, in the low-potential side drive unit DU*n, a terminal 19 of a drive IC 20n is connected to a constant-voltage power supply 62, which is externally connected to the drive IC 20n. In addition, the terminal T9 is connected to a terminal T4n via a second constant-current power supply 64 and an N-channel MOSFET (second resetting switching element 66).

The connecting point between the second constant-current power supply 64 and the second resetting switching element 66 is connected to a terminal T10 of the drive IC 20n. The terminal T10 is connected to the collector of the low-potential side switching element S*n via a second diode 68 (high-voltage diode), which is externally connected to the drive IC 20n. In particular, the anode of the second diode 68 is connected to the terminal T10, and the cathode of the second diode 68 is connected to the collector. Note that the second diode 68 is, as in the case of the first diode 42n, a rectifying device for preventing reliability of the drive IC 20n from decreasing due to the collector current flowing to the drive IC 20n.

The connecting point between the terminal T10 and the anode of the second diode 68 is connected to the emitter of the switching element S*n via a second capacitor 70, which is externally connected to the drive IC 20n.

The connecting point between the second constant-current power supply 64 and the second resetting switching element 66 is connected to a non-inverting input terminal of a comparator 72. A power supply 74, whose terminal voltage is the reference voltage Vref, is connected to an inverting input terminal of the comparator 72. An output signal of the comparator 72, which is a determination signal Sig1, is inputted into to the drive controller 50n.

Next, an overcurrent protection process according to the present embodiment will be explained.

Figure 7:
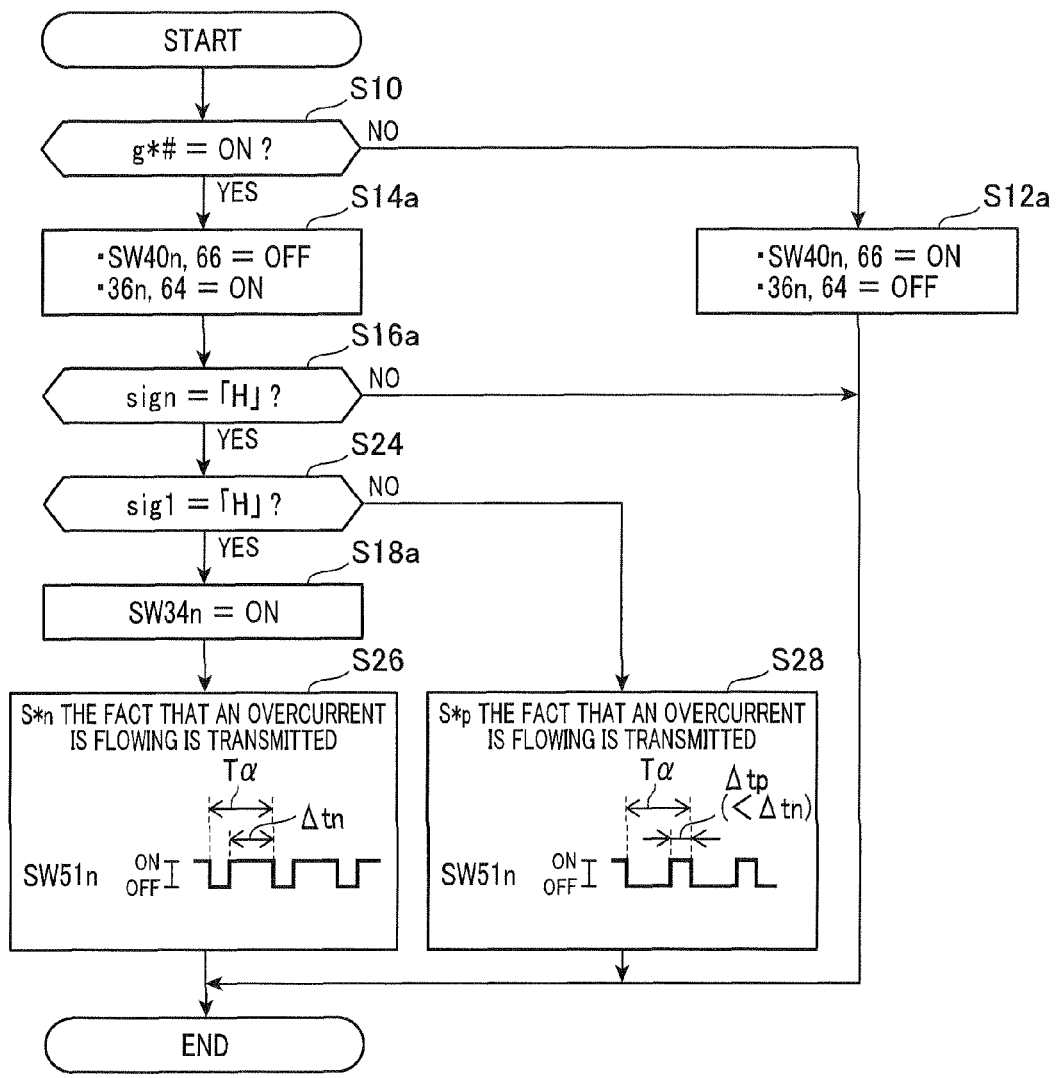
FIG. 7 is a flow diagram showing a procedure of an overcurrent protection process according to the second embodiment.

In the present embodiment, a high-potential side drive controller 50p performs the overcurrent protection process shown in FIG. 3, and a low-potential side drive controller 50n performs an overcurrent protection process shown in FIG. 7

FIG. 7 is a diagram showing a procedure of the overcurrent protection process performed by the drive controller 50n. Note that the process shown in FIG. 7 is performed by using logic circuits in practice. In FIG. 7, the same steps as those of FIG. 3 are denoted with the same reference numerals for the sake of convenience.

In this process, if a negative determination is done in step S10, the process proceeds to step S12, in which the first resetting switching element 40n and the second resetting switching element 66 are turned on, and outputting currents from the first constant-current power supply 36n and the second constant-current power supply 64 is stopped.

If a positive determination is done in step S10, the process proceeds to step S14a, in which the first resetting switching element 40n and the second resetting switching element 66 are turned off and currents are outputted from the first constant-current power supply 36n and the second constant-current power supply 64.

In succeeding step S16a, it is determined whether or not the logic of the determination signal Sign is "H".

If a positive determination is done in step S16a, the process proceeds to step S24, in which it is determined whether or not the logic of the determination signal Sig1 is "H". This process is for determining whether or not an overcurrent is flowing between the collector and the emitter of the low-potential side switching element S*n.

If a positive determination is done in step S24, the process proceeds to step S18a, in which the soft breaking switching element 34n is changed to an ON state.

In succeeding step S26, the fault transmitting switching element 51n is turned on and off with a first duty ratio to transmit the fact to the controller 14 that an overcurrent is flowing between the collector and the emitter of the low-potential side switching element S*n. In the present embodiment, the first duty ratio is a ratio of a first ON operation time period Δtn to a specified time period Ta. Hence, a fail signal FL having a pulse width depending on the first duty ratio is inputted into the controller 14.

If a negative determination is done in step S24, it is determined that an overcurrent is flowing to the high-potential side switching element S*p. Then, the process proceeds to step S28. In step S28, the fault transmitting switching element 51n is turned on and off with a second duty ratio different from the first duty ratio to transmit the fact to the controller 14 that an overcurrent is flowing to the high-potential side switching element S*p. In the present embodiment, the second duty ratio is a ratio of a second ON operation time period Δtp (Δtp<Δtn) to the specified time period Ta. Hence, a fail signal FL having a pulse width depending on the second duty ratio is inputted into the controller 14.

If the drive controller 50n includes a function for transmitting information from the low-potential side drive controller 50n to the high-potential side drive controller 50p, and a negative determination is done in step S24, a command for changing the soft breaking switching element 34p at the high-potential side to an ON state may be transmitted.

If a negative determination is done in step S16a, or steps S12a, S26, S28 are completed, the failsafe process is ended.

As described above, according to the circuit configuration of the present embodiment, the controller 14 can determine whether an overcurrent is flowing between the collector and the emitter of the high-potential side switching element S*p or the low-potential side switching element S*n.

In addition, according to the circuit configuration of the present embodiment, even when an open fault of the high-potential side terminal T7p, the diode 42n, or the fault transmitting switching element 51p, or the disconnection of the electric path connecting between the terminal T7p and the terminal T6n is caused, an overcurrent between the collector and the emitter of the low-potential side switching element S*n can be detected.

Third Embodiment

Hereinafter, the third embodiment will be described focusing on differences from the first embodiment.

In the present embodiment, a diode is added to the low-potential side drive unit DU*n, the diode detecting an overcurrent of the low-potential side switching element S*n when an open fault of the high-potential side terminal T7p is caused.

Figure 8:
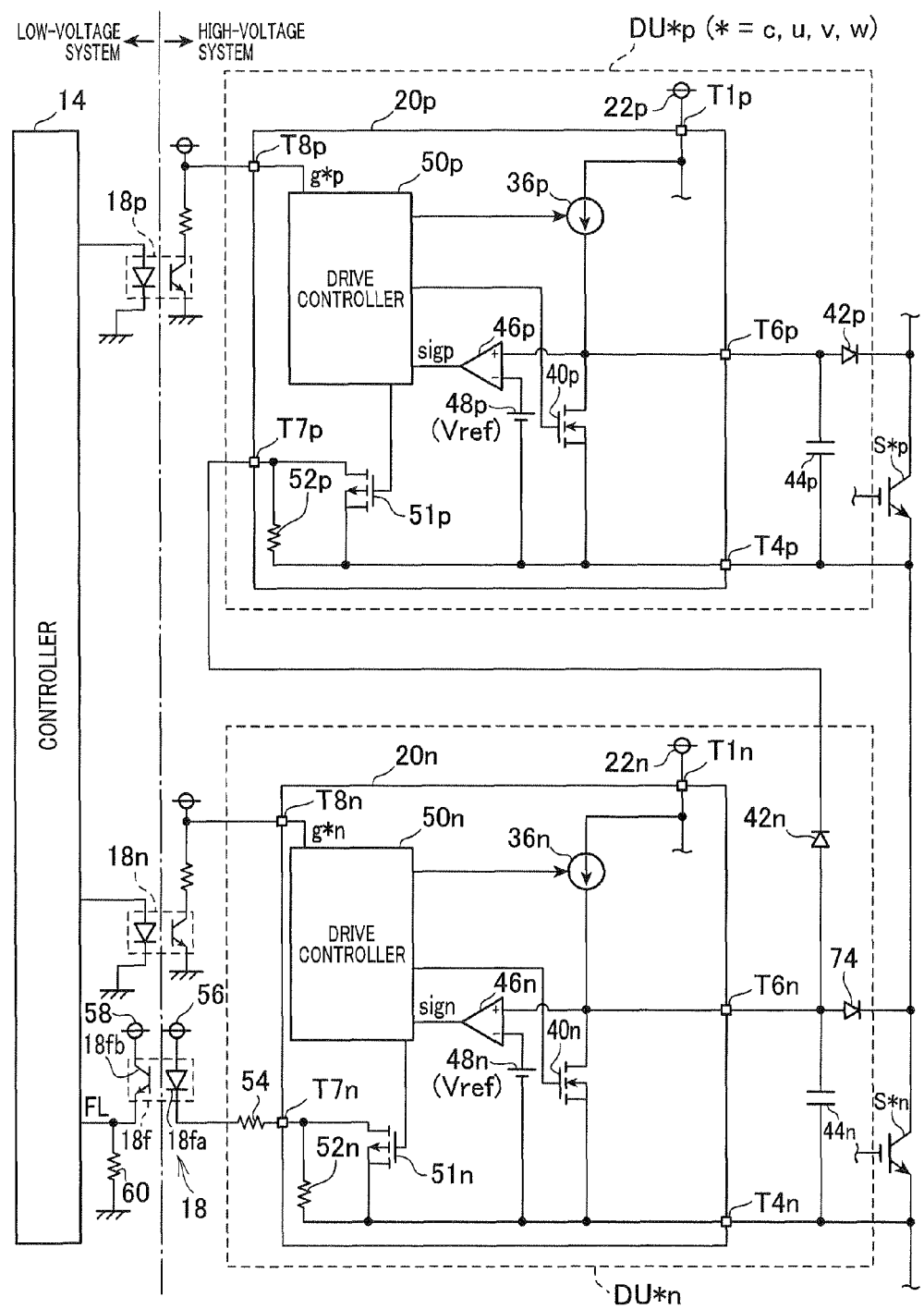
FIG. 8 is a diagram showing a configuration of a drive unit according to a third embodiment.

FIG. 8 shows configurations of the drive units DU*# and the periphery thereof according to the present embodiment. In FIG. 8, the same parts as those of FIG. 2 are denoted with the same reference numerals for the sake of convenience. Note that, in FIG. 8, since parts concerning charging and discharging processes for gate charge of the switching elements S*# and parts concerning the soft breaking function are the same as those in FIG. 2, these parts are omitted in FIG. 8. In FIG. 8, the circuit configuration of the high-potential side drive unit DU*p is the same as that shown in FIG. 2. In addition, in the present embodiment, the diode 42n is referred to as a first diode.

As shown in FIG. 8, in the low-potential side drive unit DU*n, the terminal T6n is connected to the collector of the low-potential side switching element S*n via a second diode 74 (high-voltage diode). In particular, the anode of the second diode 74 is connected to the terminal T6n, and the cathode thereof is connected to the collector. Note that the second diode 74 is a rectifying device preventing reliability of the drive IC 20n from decreasing when a collector current flows into the drive IC 20n, as in the case of the first diode 42n.

According to the above circuit configuration, as in the case of the second embodiment, even when an open fault of the high-potential side terminal T7p is caused, an overcurrent of the low-potential side switching element S*n can be detected. In addition, since a comparator 46n is shared between the first diode 42n and the second diode 74, the circuit configuration can be simplified.

Fourth Embodiment

Hereinafter, the fourth embodiment will be described focusing on differences from the second embodiment.

In the present embodiment, the circuit configuration of the drive unit DU*n for detecting an overcurrent is modified so as to use a resistor instead of the capacitor.

Figure 9:
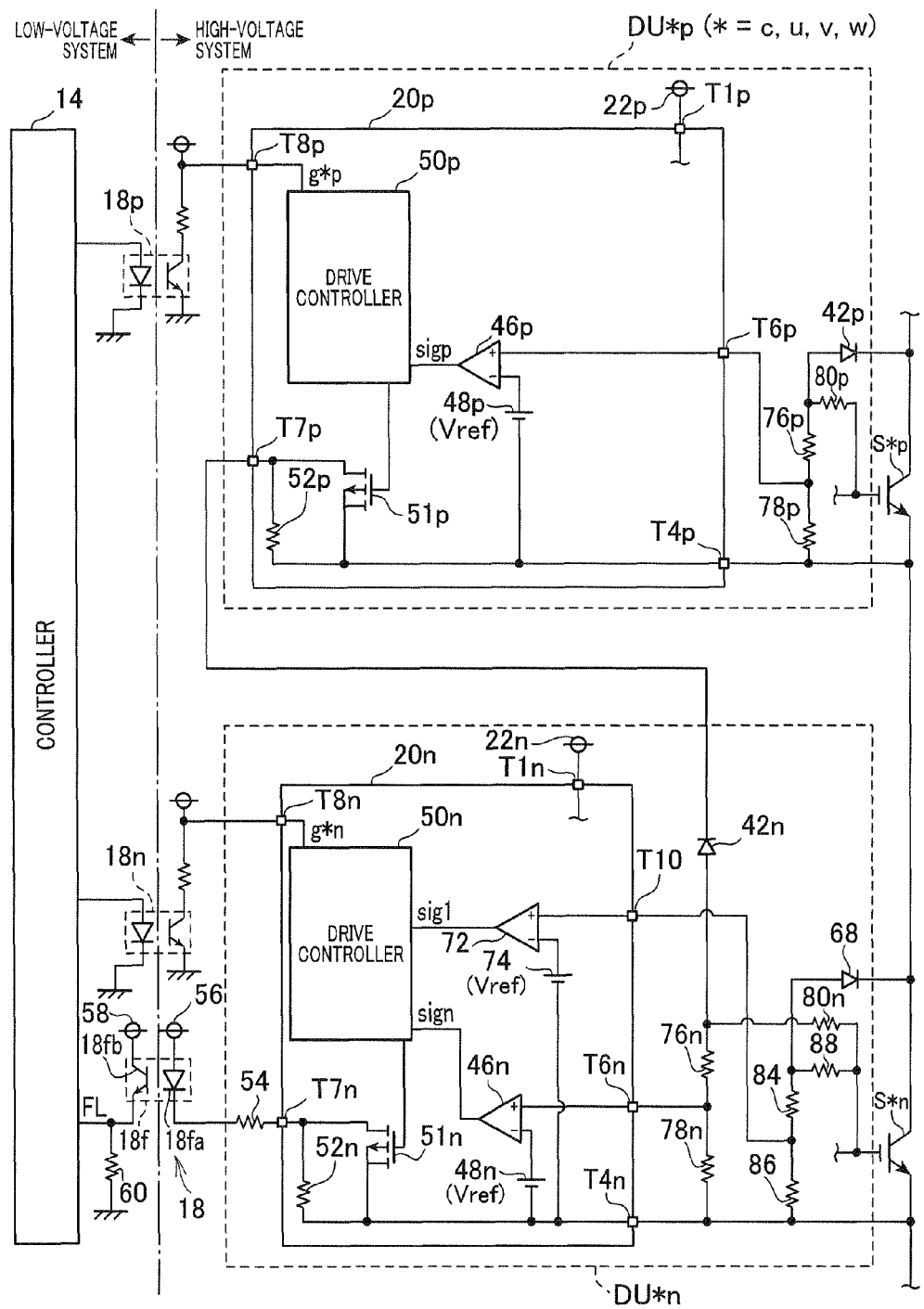
FIG. 9 is a diagram showing a configuration of a drive unit according to a fourth embodiment

FIG. 9 shows configurations of the drive units DU*# and the periphery thereof according to the present embodiment. In FIG. 9, the same parts as those of FIG. 6 are denoted with the same reference numerals for the sake of convenience. Note that, in FIG. 9, since parts concerning charging and discharging processes for gate charge of the switching elements S*# and parts concerning the soft breaking function are the same as those in FIG. 6, these parts are omitted in FIG. 9.

In the present embodiment, the circuit configuration of the high-potential side drive unit DU*p and that of the low-potential side drive unit DU*n are basically the same. Hence, hereinafter, commonalities between the drive unit DU*p and the drive unit DU*n will be first explained. Then, dissimilarities between the drive unit DU*p and the drive unit DU*n will be explained.

First, commonalities between the drive units DU*# will be explained.

As shown in FIG. 9, the anode of the first diode 42# (#=p, n) is connected to the emitter of the switching element S*# via a series connection of resistors 76# and 78#. The connecting point between the resistor 76# and the anode of the first diode 42# is connected to the gate of the switching element S*# via a resistor 80#. The connecting point between the resistors 76# and 78# is connected to the non-inverting input terminal of a comparator 46# via the terminal T6#.

Next, dissimilarities between the high-potential side drive unit DU*p and the low-potential side drive unit DU*n will be explained.

The collector of the low-potential side switching element S*n is connected to the emitter of the switching element S*n via the second diode 68 and a series connection of resistors 84, 86. In particular, the anode of the second diode 68 is connected to one end of the series connection of the resistors 84, 86, and the cathode of the second diode 68 is connected to the collector of the switching element S*n. The end of the series connection of the resistors 84, 86 at the second diode 68 is connected to the gate of the switching element S*n via a resistor 88. The connecting point between the resistors 84 and 86 is connected to the non-inverting input terminal of the comparator 72 via the terminal T10.

Note that the resistance values of the resistors 76p, 76n, 84 are the same. The resistance values of the resistors 78p, 78n, 86 are also the same. The resistance values of the resistors 80p, 80n, 88 are also the same.

In the present embodiment, a value obtained by multiplying a value, which is obtained by dividing the resistance value of the resistor 78p by the sum of the resistance values of the resistors 76p, 76n, 80p, by a terminal voltage of a constant-voltage power supply 22p is defined as a specified voltage. In addition, the reference voltage Vref of the power supplies 48p, 48n, 74 is lower than the specified voltage and higher than 0 V.

Next, the principle of detecting an overcurrent according to the present embodiment will be explained.

By changing the operation signal g*# from an OFF operation command to an ON operation command, the gate voltage and the voltage of the terminal T6# starts increasing. Thereafter, when the gate voltage exceeds the threshold voltage, the switching element S*# is changed from an OFF state to an ON state. When an overcurrent does not flow to the switching element S*#, the voltage Vice between the emitter and the collector significantly decreases. Thereby, the current supplied from the constant-voltage power supply 22# to the gate flows to the collector via the resistor 80# and the first diode 42#. Hence, the current does not flow to the resistors 76#, 78#, whereby the voltage of the terminal T6# becomes 0 V.

In contrast, when an overcurrent flows to the switching element S*#, the voltage between the collector and the emitter is higher voltage due to higher collector current even though the switching element S*# is changed to an ON state. Thereby, the electric potential at the anode of the diode 42# becomes lower than the electric potential of the collector. Hence, the flow of the current from the terminal T6# to the collector via the diode 42# is blocked. Thereby, even when the switching element S*# is changed to an ON state, the voltage of the terminal T6# becomes equal to the specified voltage.

Note that variation of voltage of the terminal 10 is similar to that of the terminal T6#.

Focusing on the variation of the voltage of the terminal T6#, an overcurrent between the collector and the emitter of the switching element S*# can be detected by using a technique according to the technique for detecting an overcurrent explained with reference to FIGS. 3 and 7. In particular, in the case of the high-potential side switching element S*n, the process of step S16 in FIG. 3 is replaced with a process in which it is determined whether the determination signal Sigp is "H" or not during the period of time during which the operation signal g*p serves as an ON operation command and at the timing when a specified time period has passed after the gate voltage exceeds the threshold voltage.

In contrast, in the case of the low-potential side switching element S*n, the process of step S16a in FIG. 7 is replaced with a process in which it is determined whether the determination signal Sign is "H" or not at the timing when the specified time period has passed. In addition, the process of step S24 is replaced with a process in which it is determined whether the determination signal Sig1 is "H" or not at the timing when the specified time period has passed.

As described above, the overcurrent protection process can also be performed appropriately by the circuit configuration according to the present embodiment.

Other embodiments

The above embodiments can be modified as described below.

In the above embodiments, the resistor 52p in the drive IC 20p can be omitted. In this case, by changing the fault transmitting switching element 51p to an OFF state, the current flowing between the diode 42n and the emitter of the high-potential side switching element S*p is blocked. Hence, the fact that an overcurrent is flowing between the collector and the emitter of the high-potential side switching element S*p can be transmitted to the low-potential side drive controller 50n.

In the above second embodiment, the technique for determine whether an overcurrent is flowing to the high-potential side switching element S*p or the low-potential side switching element S*n is not limited to varying the pulse width of the fail signal FL. For example, the pulse frequency can be varied.

In the second embodiment, a common constant-current power supply may apply voltage to the capacitors 44n, 70.

In the above embodiments, a circuit configuration is used in which the terminal T6n of the low-potential side drive IC 20n is connected to the terminal T7p (open drain terminal) of the high-potential side drive IC 20p via the diode 42n. However, a circuit configuration can be used, for example, in which the terminal T6h is directly connected to the emitter of the switching element S*p via the diode 42n and a MOSFET.

The interface for transmitting and receiving signals between the high-voltage system including the high-voltage battery 12 and the low-voltage system including the low-voltage battery 16, while insulating therebetween, is not limited to a photocoupler, which is an optical insulation element. For example, a transformer, which is a magnetic insulation element, may be used.

In the fourth embodiment, the second diode 68 and the resistors 80n, 84, 86, 88 shown in FIG. 9 may be omitted. In addition to omitting them, the second diode 74 shown in FIG. 8 of the third embodiment may be included in FIG. 9.

The rectifying device is not limited to a diode but may be another semiconductor device, if the semiconductor device has a function for allowing the flow of a forward current and blocking the flow of a reverse current.

In the above embodiments, an optical insulation element is used for transmitting information, which is concerning the fact that an overcurrent is flowing from the high-voltage system to the low-voltage system. However, for example, if a failsafe processor performing the shutdown process is included in the high-voltage system, the configuration for transmitting the information from the drive controller 50n to the processor may be realized by using an element other than the optical insulation element.

In the first embodiment, capacitances of the capacitors 44p, 44n may be different from each other. For example, if the capacitance of the capacitor 44p is larger than that of the capacitor 44n, the terminal voltage of the power supply 48p is lower than that of the power supply 48n.

In the first embodiment, if the converter CV is not driven, or if a configuration in which the inverter IV is directly connected to the high-voltage battery 12 is used, the high-voltage battery 12 is used as a DC power supply.

The switching element S*# is not limited to an IGBT but may be, for example, a MOSFET.

The object to which the drive circuits according to the above embodiments are applied is not limited to a power inverter circuit (converter CV, inverter IV) installed in a vehicle.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

As an aspect of the embodiment, a drive circuit for switching elements is provided which is applied to a power inverter circuit (CV, IV) including a high-potential side switching element (S*P; *=c, u, v, w) and a low-potential side switching element (S*n) connected to the high-potential side switching element in series. The drive circuit includes: a first electric path which connects an input terminal and an output terminal of the high-potential side switching element and which includes a high-potential side rectifying device (42$p$), which blocks a flow of current from the input terminal to the output terminal, and a high-potential side passive element, which is a capacitor (44$p$) or a resistor (78$p$), the high-potential side rectifying device and the high-potential side passive element being arranged sequentially from the input terminal of the high-potential side switching element; a second electric path which connects the output terminal of the high-potential side switching element and the output terminal of the low-potential side switching element and which includes a low-potential side rectifying device (42$n$), which blocks a flow of current from the output terminal of the high-potential side switching element to the output terminal of the low-potential side switching element, and a low-potential side passive element, which is a capacitor (44$n$) or a resistor (78$n$), the low-potential side rectifying device and the low-potential side passive element being arranged sequentially from the output terminal of the high-potential side switching element; a high-potential side applying unit (36$p$, 22$p$) which applies voltage to a connecting point between the high-potential side rectifying device and the high-potential side passive element during a time period during which the high-potential side switching element is turned on; a high-potential side determining unit which determines that an overcurrent is flowing between the input terminal and the output terminal of the high-potential side switching element on the basis of the fact that an electric potential of the connecting point between the high-potential side rectifying device and the high-potential side passive element exceeds a first specified value even though the high-potential side switching element is change from an OFF state to an ON state; a limiting unit which limits a flow of current between the low-potential side rectifying device and the output terminal of the high-potential side switching element if the high-potential side determining unit determines that the overcurrent is flowing; a low-potential side applying unit (36$n$, 22$n$) which applies voltage to a connecting point between the low-potential side rectifying device and the low-potential side passive element during a time period during which the low-potential side switching element is turned on; and a low-potential side determining unit which determines that an overcurrent is flowing between the input terminal and the output terminal of the high-potential side switching element or the low-potential side switching element on the basis of the fact that an electric potential of the connecting point between the low-potential side rectifying device and the low-potential side passive element exceeds a second specified value even though the low-potential side switching element is changed from an OFF state to an ON state.

According to the above drive circuit, if the high-potential side determining unit determines that an overcurrent is flowing between the input terminal and the output terminal of the high-potential side switching element, the limiting unit limits the flow of current. Hence, thereafter, when the low-potential side determining unit determines whether or not an overcurrent is flowing between the input terminal and the output terminal of the low-potential side switching element, discharging from the low-potential side passive element to the output terminal of the high-potential side switching element is limited by the low-potential side rectifying device. Thereby, the electric potential of the connecting point between the low-potential side rectifying device and the low-potential side passive element does not decrease during a time period during which the low-potential side switching element is turned on. As a result, the electric potential of the connecting point exceeds the second specified value. Hence, the low-potential side determining unit can detect the fact that an overcurrent is flowing between the input terminal and the output terminal of the high-potential side switching element.

According to the above drive circuit, without providing a transmitting unit, which transmits to the outside of the drive circuit the fact that the overcurrent is flowing, for each of the high-potential side switching element and the low-potential side switching element, but by providing the transmitting unit only for the low-potential side switching element, the fact that an overcurrent is flowing between the input terminal and the output terminal of the high-potential side switching element or the low-potential side switching element can be transmitted to the outside of the drive circuit. That is, the number of components of a configuration for transmitting the above fact can be reduced.

What is claimed is:

1. A drive circuit for switching elements which is applied to a power inverter circuit including a high-potential side switching element and a low-potential side switching element connected to the high-potential side switching element in series, comprising:

a first electric path which connects an input terminal and an output terminal of the high-potential side switching element and which includes a high-potential side rectifying device, which blocks a flow of current from the input terminal to the output terminal, and a high-potential side passive element, the high-potential side rectifying device and the high-potential side passive element being arranged sequentially from the input terminal of the high-potential side switching element;

a second electric path which connects the output terminal of the high-potential side switching element and an output terminal of the low-potential side switching element and which includes a low-potential side rectifying device, which blocks a flow of current from the output terminal of the high-potential side switching element to the output terminal of the low-potential side switching element, and a low-potential side passive element, the low-potential side rectifying device and the low-potential side passive element being arranged sequentially from the output terminal of the high-potential side switching element;

a high-potential side applying unit which applies voltage to a connecting point between the high-potential side rectifying device and the high-potential side passive element during a time period during which the high-potential side switching element is turned on;

a high-potential side determining unit which determines that an overcurrent is flowing between the input terminal and the output terminal of the high-potential side switching element based on that an electric potential of the connecting point between the high-potential side rectifying device and the high-potential side passive element exceeding a first specified value even though the high-potential side switching element is change from an OFF state to an ON state;

a limiting unit which limits a flow of current between the low-potential side rectifying device and the output terminal of the high-potential side switching element if the high-potential side determining unit determines that the overcurrent is flowing;

a low-potential side applying unit which applies voltage to a connecting point between the low-potential side rectifying device and the low-potential side passive element during a time period during which the low-potential side switching element is turned on; and a low-potential side determining unit which determines that an overcurrent is flowing between the input terminal and the output terminal of the high-potential side switching element or between the input terminal and the output terminal of the low-potential side switching element based on an electric potential of the connecting point between the low-potential side rectifying device and the low-potential side passive element exceeding a second specified value even though the low-potential side switching element is changed from an OFF state to an ON state.

2. The drive circuit according to claim 1, wherein
the low-potential side rectifying device is defined as a first low-potential side rectifying device,
the low-potential side passive element is defined as a first low-potential side passive element,
the drive circuit further comprises a third electric path which connects an input terminal and the output terminal of the low-potential side switching element and which includes a second low-potential side rectifying device, which blocks a flow of current from the input terminal to the output terminal of the low-potential side switching element, and a second low-potential side passive element, the second low-potential side rectifying device and the second low-potential side passive element being arranged sequentially from the input terminal of the low-potential side switching element,
the low-potential side applying unit applies voltage to the connecting point between the first low-potential side rectifying device and the first low-potential side passive element and a connecting point between the second low-potential side rectifying device and the second low-potential side passive element, and
the low-potential side determining unit determines that an overcurrent is flowing between the input terminal and the output terminal of the low-potential side switching element based on that an electric potential of the connecting point between the second low-potential side rectifying device and the second low-potential side passive element exceeding the second specified value even though the low-potential side switching element is changed from the OFF state to the ON state.

3. The drive circuit according to claim 2, further comprising a transmitting unit which transmits to an outside of the drive circuit, if the low-potential side determining unit determines that an overcurrent is flowing, a signal indicating that the overcurrent is flowing, wherein
the transmitting unit changes a manner of the transmission depending on whether an overcurrent is determined to be flowing between the input terminal and the output terminal of the high-potential side switching element or between the input terminal and the output terminal of the low-potential side switching element.

4. The drive circuit according to claim 1, wherein
the low-potential side rectifying device is defined as a first low-potential side rectifying device, and
the input terminal of the low-potential side switching element and a connecting point between the first low-potential side rectifying device and the low-potential side passive element are connected by a second low-potential side rectifying device which blocks a flow of current from the input terminal of the low-potential side switching element to the connecting point between the first low-potential side rectifying device and the low-potential side passive element.

5. The drive circuit according to claim 1, wherein
the drive circuit includes a high-potential side circuit and a low-potential side circuit,
the high-potential side determining unit is included in the high-potential side circuit,
the low-potential side determining unit is included in the low-potential side circuit,
the high-potential side circuit includes a first high-potential side terminal connected to the output terminal of the high-potential side switching element, a second high-potential side terminal, and a high-potential side opening and closing element which opens and closes an electric path connecting the first high-potential side terminal and the second high-potential side terminal,
the limiting unit limits the flow of current by turning off the high-potential side opening and closing element, and
an end of the low-potential side rectifying device, which is opposed to the low-potential side passive element, is connected to the second high-potential side terminal.

6. The drive circuit according to claim 1, further comprising a transmitting unit which transmits to the outside of the drive circuit, if the low-potential side determining unit determines that the overcurrent is flowing, a signal indicating that the overcurrent is flowing, wherein
the transmitting unit is an insulation element which has an input part and an output part and transmits to the output part a signal corresponding to a current flowing to the input part while insulating between the input part and the output part.

* * * * *